(12) United States Patent
Furuta

(10) Patent No.: US 7,741,908 B2
(45) Date of Patent: Jun. 22, 2010

(54) HIGH SPEED AMPLIFIER WITH CONTROLLABLE AMPLIFICATION AND OUTPUT IMPEDANCE AND COMPARATOR USING THE SAME

(75) Inventor: Atsushi Furuta, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 218 days.

(21) Appl. No.: 11/783,112

(22) Filed: Apr. 5, 2007

(65) Prior Publication Data
US 2007/0279130 A1 Dec. 6, 2007

(30) Foreign Application Priority Data
Apr. 6, 2006 (JP) ............................. 2006-105372

(51) Int. Cl.
*H03F 3/45* (2006.01)
(52) U.S. Cl. .................. 330/253; 330/254; 330/310; 330/144
(58) Field of Classification Search ................. 330/253, 330/254, 310, 144
See application file for complete search history.

(56) References Cited

U.S. PATENT DOCUMENTS

| | | | | |
|---|---|---|---|---|
| 3,845,404 A | * | 10/1974 | Trilling | ................. 330/69 |
| 4,054,849 A | * | 10/1977 | Yamada | ................. 333/14 |
| 4,599,574 A | * | 7/1986 | Chambers | ................. 330/254 |
| 5,142,242 A | * | 8/1992 | Schaffer | ................. 330/253 |
| 5,337,230 A | * | 8/1994 | Baumgartner et al. | ........... 700/9 |
| 5,872,475 A | * | 2/1999 | Otaka | ................. 327/308 |
| 6,313,779 B1 | | 11/2001 | Leung et al. | |
| 6,448,813 B2 | * | 9/2002 | Garlepp et al. | ............. 326/83 |
| 7,468,688 B2 | * | 12/2008 | Hesener | ................. 341/144 |

FOREIGN PATENT DOCUMENTS

JP  10-200385  7/1998

* cited by examiner

*Primary Examiner*—Patricia Nguyen
(74) *Attorney, Agent, or Firm*—McGinn IP Law Group, PLLC

(57) ABSTRACT

In an amplifier including first and second power supply terminals, first and second output terminals, a first load connected between the first power supply terminal and the first output terminal, a second load connected between the first power supply terminal and the second output terminal, a constant current source connected to the second power supply terminal, a first transistor connected between the first output terminal and the constant current source, a control terminal of the first transistor being adapted to receive an input voltage, and a second transistor connected between the second output terminal and the constant current source, a control terminal of the second transistor being adapted to receive a reference voltage, an amplification and output impedance switching circuit is connected between the first and second output terminals, so that the amplifier and output impedance switching circuit controls an amplification and output impedance of the amplifier in accordance with a control signal.

13 Claims, 16 Drawing Sheets

Fig. 2 PRIOR ART

| $V_{in}$ | D3 | D2 | D1 | D0 |
|---|---|---|---|---|
| $V_{15}$ | 1 | 1 | 1 | 1 |
| $V_{14}$ | 1 | 1 | 1 | 0 |
| $V_{13}$ | 1 | 1 | 0 | 1 |
| $V_{12}$ | 1 | 1 | 0 | 0 |
| $V_{11}$ | 1 | 0 | 1 | 1 |
| $V_{10}$ | 1 | 0 | 1 | 0 |
| $V_{9}$ | 1 | 0 | 0 | 1 |
| $V_{8}$ | 1 | 0 | 0 | 0 |
| $V_{7}$ | 0 | 1 | 1 | 1 |
| $V_{6}$ | 0 | 1 | 1 | 0 |
| $V_{5}$ | 0 | 1 | 0 | 1 |
| $V_{4}$ | 0 | 1 | 0 | 0 |
| $V_{3}$ | 0 | 0 | 1 | 1 |
| $V_{2}$ | 0 | 0 | 1 | 0 |
| $V_{1}$ | 0 | 0 | 0 | 1 |
| $V_{0}$ | 0 | 0 | 0 | 0 |

HIGH SPEED AMPLIFIER WITH CONTROLLABLE AMPLIFICATION AND OUTPUT IMPEDANCE AND COMPARATOR USING THE SAME

BACKGROUND OF THE INVENTION

1. Field of the Invention

The present invention relates to a high speed amplifier and a comparator using the same applied to a sequential successive approximation analog-to-digital (A/D) converter.

2. Description of the Related Art

Generally, A/D converters are required to accurately convert an analog signal into a digital signal at high speed.

One typical A/D converter is a sequential successive approximation A/D converter which is constructed by a comparator for comparing an input voltage with a reference voltage derived from an input analog voltage, a sequential approximation register (SAR), a digital-to-analog (D/A) converter for performing a D/A conversion upon the content of the sequential approximation register to generate the input voltage, and a control circuit for controlling the content of the sequential approximation register in accordance with the output signal of the comparator. This will be explained later in detail.

A first prior art comparator is constructed by a plurality of cascaded fast amplifiers of a two-input and two-output type with a low gain (amplification) and a low output impedance operable at high speed, and a slow amplifier of a two-input and one-output type with a high gain (amplification) and a high output impedance operable at low speed (see: FIG. 7 of JP-10-200385A). This also will be explained later in detail.

In the above-described first prior art comparator, however, when the input voltage crosses the reference voltage, one return delay time is caused by each of the fast amplifiers, so that the total delay time would be increased. Also, the operation speed of the fast amplifiers per se cannot be increased. Thus, the first prior art comparator cannot be operated at a high speed.

In a second prior art comparator, switches are provided at the output ends of each of the fast amplifiers of the first prior art comparator (see: FIGS. 1 and 2 of JP-10-200385A). As a result, every time a stable time period has passed after one comparison operation, the above-mentioned switches are turned ON, so that the output voltages of the fast amplifiers are initialized or reset to their operating points. Therefore, since no return delay times are generated, the total delay time is not increased. Thus, the second prior art comparator may be operated at high speed. This also will be explained later in detail.

SUMMARY OF THE INVENTION

In the above-described second prior art comparator, however, since the OFF timings of the above-mentioned switches must be determined in view of the maximum values of delay time periods of the fast amplifiers, the stable time period is not always short, so that the total delay time would not always be decreased. Also, the operation speed of the fast amplifiers per se cannot be increased. Thus, the second prior art comparator would not always be operated at high speed.

According to the present invention, in an amplifier including first and second power supply terminals, first and second output terminals, a first load connected between the first power supply terminal and the first output terminal, a second load connected between the first power supply terminal and the second output terminal, a constant current source connected to the second power supply terminal, a first transistor connected between the first output terminal and the constant current source, a control terminal of the first transistor being adapted to receive an input voltage, and a second transistor connected between the second output terminal and the constant current source, a control terminal of the second transistor being adapted to receive an reference voltage, an amplification and output impedance switching circuit is connected between the first and second output terminals, so that the amplification and output impedance switching circuit controls the amplification and output impedance of the amplifier in accordance with a control signal.

Also, first, the control signal is a first value to make the amplifier have a first amplification and a first output impedance, and then, the control signal is a second value to make the amplifier have a second amplification higher than the first amplification and a second output impedance higher than the first output impedance. Thus, the operation speed of the amplifier is substantially increased.

Thus, in the amplifier according to the present invention, the amplification and output impedance is controlled by changing the resistance between the first and second output terminals without changing the resistance values of the first and second loads. In other words, the operating output points of the amplifier are unchanged at a switching of the amplification and output impedance by the control signal.

Further in a comparator including a plurality of first amplifiers of a two-input and two-output type connected in series and a second amplifier of a two-input and one-output type connected to a final one of the first amplifiers, the above-mentioned amplifier is used as at least one of the first amplifiers, so that the total delay time caused by the first amplifiers can be decreased.

Thus, even in the comparator according to the present invention, even when the amplification and output impedance of the above-mentioned amplifier is changed, the operating output points of the amplifier are unchanged so that the delay of comparison operations is not generated.

BRIEF DESCRIPTION OF THE DRAWINGS

The present invention will be more clearly understood from the description set forth below, as compared with the prior art, with reference to the accompanying drawings, wherein:

FIG. 2 is a table showing a digital output signal of the sequential successive approximation A/D converter of FIG. 1;

DESCRIPTION OF THE PREFERRED EMBODIMENT

Before the description of the preferred embodiment, a prior art sequential successive approximation A/D converter and prior art comparators applied to the sequential successive approximation A/D converter will be explained with reference to FIGS. 1 to 7.

Figure 1:
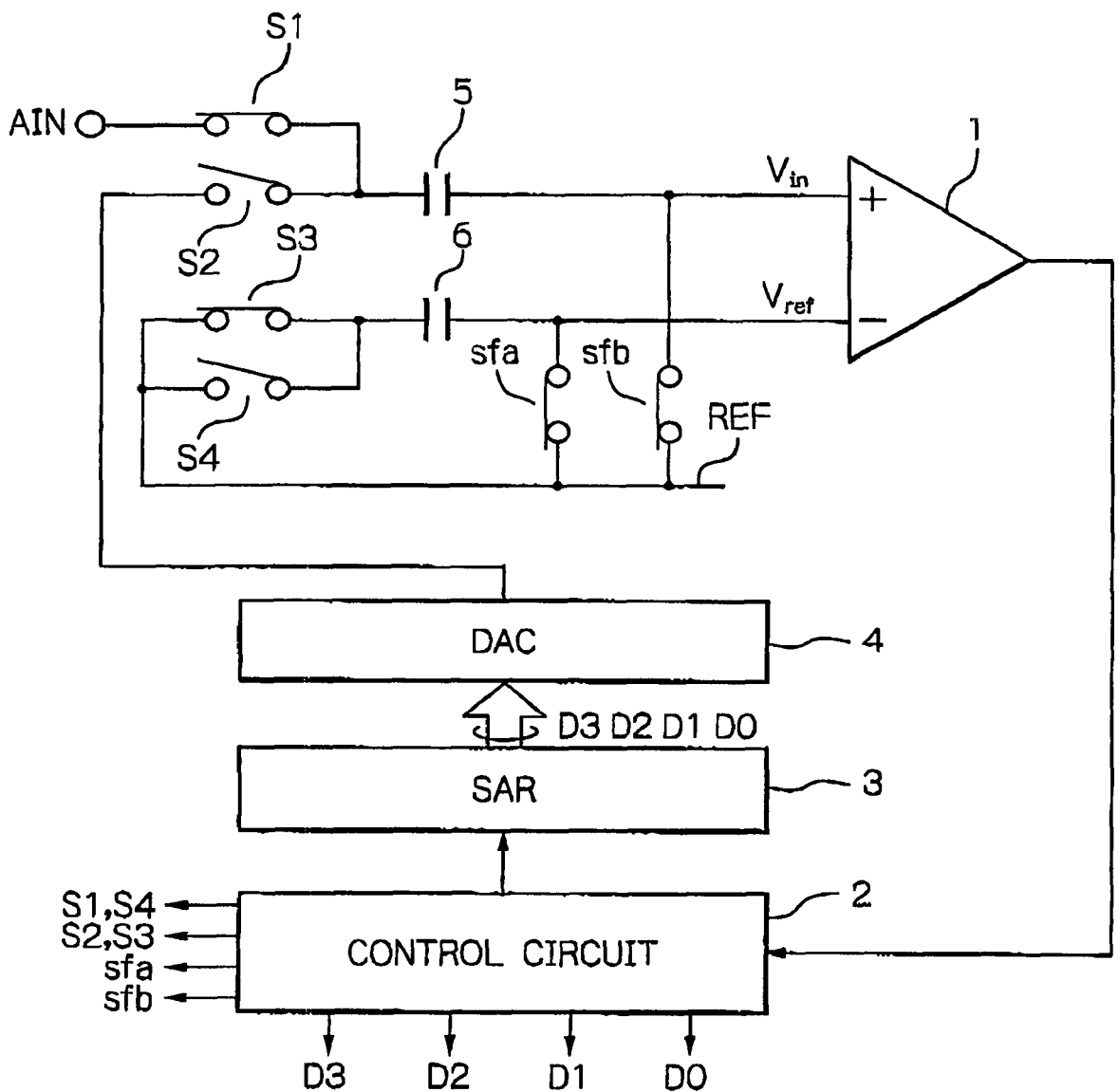
FIG. 1 is a circuit diagram illustrating a prior art sequential successive approximation A/D converter.

In FIG. 1, which illustrates a prior art sequential successive approximation A/D converter, a comparator 1 compares an input voltage $V_{in}$ with a reference voltage $V_{ref}$ to generate an output voltage $V_{out}$. A control circuit receives the output signal of the comparator 1 to control a content of a sequential approximation register (SAR) 3. A digital-to-analog (D/A) converter 4 performs a D/A conversion upon the content of the sequential approximation register 3 to generate the input voltage $V_{in}$.

On the other hand, an end of an input capacitor 5 is connected to a positive input of the comparator 1, and an end of a reference capacitor 6 is connected to a negative input of the comparator 1. In this case, the capacitance of the input capacitor 5 is the same as that of the reference capacitor 6, so that the input capacitor 5 and the reference capacitor 6 form a complete differential pair.

A switch S1 is connected to the other end of the input capacitor 5 to receive an analog voltage AIN.

A switch S2 is connected between the output of the D/A converter 4 and the other end of the input capacitor 5 to receive the analog output voltage of the D/A converter 4.

Switches S3 and S4 are connected between the other end of the reference capacitor 6 and a reference line REF which is further connected via switches sfa and sfb to the positive input and negative input, respectively, of the comparator 1.

The switches S1 and S2 are complementary. That is, when one of the switches S1 and S2 is turned ON, the other is turned OFF. Also, the switches S3 and S4 are complementary. That is, when one of the switches S3 and S4 is turned ON, the other is turned OFF.

Since the two switches S1 and S2 are provided for the input capacitor 5 while the switches S3 and S4 are provided for the reference capacitor 6, the capacitance of the Input capacitor 5 including its parasitic capacitance is substantially the same as that of the reference capacitor 6 including its parasitic capacitance.

On the other hand, the switches S1 and S3 are complementary. That is, when one of the switches S1 and S3 is turned ON, the other is turned OFF. Also, the switches S2 and S4 are complementary. That is, when one of the switches S2 and S4 is turned ON, the other is turned OFF. Thus, the noise due to the switching of the switches S1, S2, S3 and S4 can be diminished.

The control circuit 2 also controls the switches S1 and S4, the switches S2 and S3, and the switches sfa and sfb.

The operation of the sequential successive approximation A/D converter of FIG. 1 includes a sample/hold mode for sampling and holding the analog voltage AIN as a reference voltage $V_{ref}$, and a comparison mode. In the comparison mode, the comparator 1 carries out n times of comparison operations to obtain an n-bit digital signal such as a 4-bit digital signal denoted by D3, D2, D1 and D0.

First, in the sample/hold mode, the control circuit 2 turns ON the switches S1, S4, sfa and sfb, and turns OFF the switches S2 and S3. As a result, the Input capacitor 5 is charged by the difference between the analog voltage AIN and the voltage at the reference line REF, while the ends of the reference capacitor 6 are not charged. Therefore, the reference voltage $V_{ref}$ at the reference line REF, i.e., at the negative input of the comparator 1 corresponds to the analog voltage AIN.

In a comparison mode, the control circuit 2 turns ON the switches S2 and S3 and turns OFF the switches S1, S4, sfa and sfb, so that comparison operations are carried out four times. Note that the reference voltage $V_{ref}$(AIN) is maintained at the negative input of the comparator 1 by the turned-OFF switches sfa and sfb. Also, assume that, when the sequential approximation register 3 generates a 4-bit digital signal (D3, D2, D1, D0), the digital-to-analog converter 4 generates the input voltage $V_{in}$ as illustrated in FIG. 2. In this case, assume that the analog input voltage AIN is between $V_5$ and $V_6$.

First, the control circuit 2 sets "1000" where only the most significant bit (MSB) D3 is "1" in the sequential approximation register 3. As a result, the digital-to-analog converter 4 supplies $V_8$ to the capacitor 5, so that $V_{in}=V_8-AIN+V_{ref}$. Therefore, since $V_{in}=V_8-AIN+V_{ref}>V_{ref}$) the output voltage $V_{out}$ of the comparator 1 is high.

Next, upon receipt of the high output voltage $V_{out}$ of the comparator 1, the control circuit 2 resets the most significant bit D3 (D3=0) and sets the second significant bit D2 (D2=1). That is, the control circuit 2 sets "0100" in the sequential approximation register 3. As a result, the digital-to-analog converter 4 supplies $V_4$ to the capacitor 5, so that $V_{in}=V_4-AIN+V_{ref}$. Therefore, since $V_{in}=V_4-AIN+V_{ref}<V_{ref}$, the output voltage $V_{out}$ of the comparator 1 is low.

Next, upon receipt of the low output voltage $V_{out}$ of the comparator 1, the control circuit 2 sets the third significant bit D1 (D1=1). That is, the control circuit 2 sets "0110" in the sequential approximation register 3. As a result, the digital-to-analog converter 4 supplies $V_6$ to the capacitor 5, so that $V_{in}=V_6-AIN+V_{ref}$. Therefore, since $V_{in}=V_6-AIN+V_{ref}>V_{ref}$) the output voltage $V_{out}$ of the comparator 1 is high.

Finally, upon receipt of the high output voltage $V_{out}$ of the comparator 1, the control circuit 2 resets the third significant bit D1 (D1=0) and sets the least significant bit (LSB) D0 (D0=1). That is, the control circuit 2 sets "0101" in the sequential approximation register 3. As a result, the digital-to-analog converter 4 supplies $V_5$ to the capacitor 5, so that $V_{in}=V_5-AIN+V_{ref}$. Therefore, since $V_{in}=V_5-AIN+V_{ref}<V_{ref}$, the output voltage $V_{out}$ of the comparator 1 is low.

Thus, the 4-bit digital signal (D3, D2, D1, D0)=(0, 1, 0, 1) is obtained.

Note that a time period of comparison operation for 1-bit is defined by $T_{cycle}$.

In the sequential successive approximation A/D converter of FIG. 1, in order to carry out an A/D conversion, the comparator 1 is required to accurately amplify a very small difference between the input voltage $V_{in}$ and the reference voltage $V_{ref}$ at a high speed. For this purpose, the comparator 1 is generally formed by multi-stage cascaded amplifiers (or differential amplifiers) each with a small gain (amplification) and a small output impedance.

Figure 3:
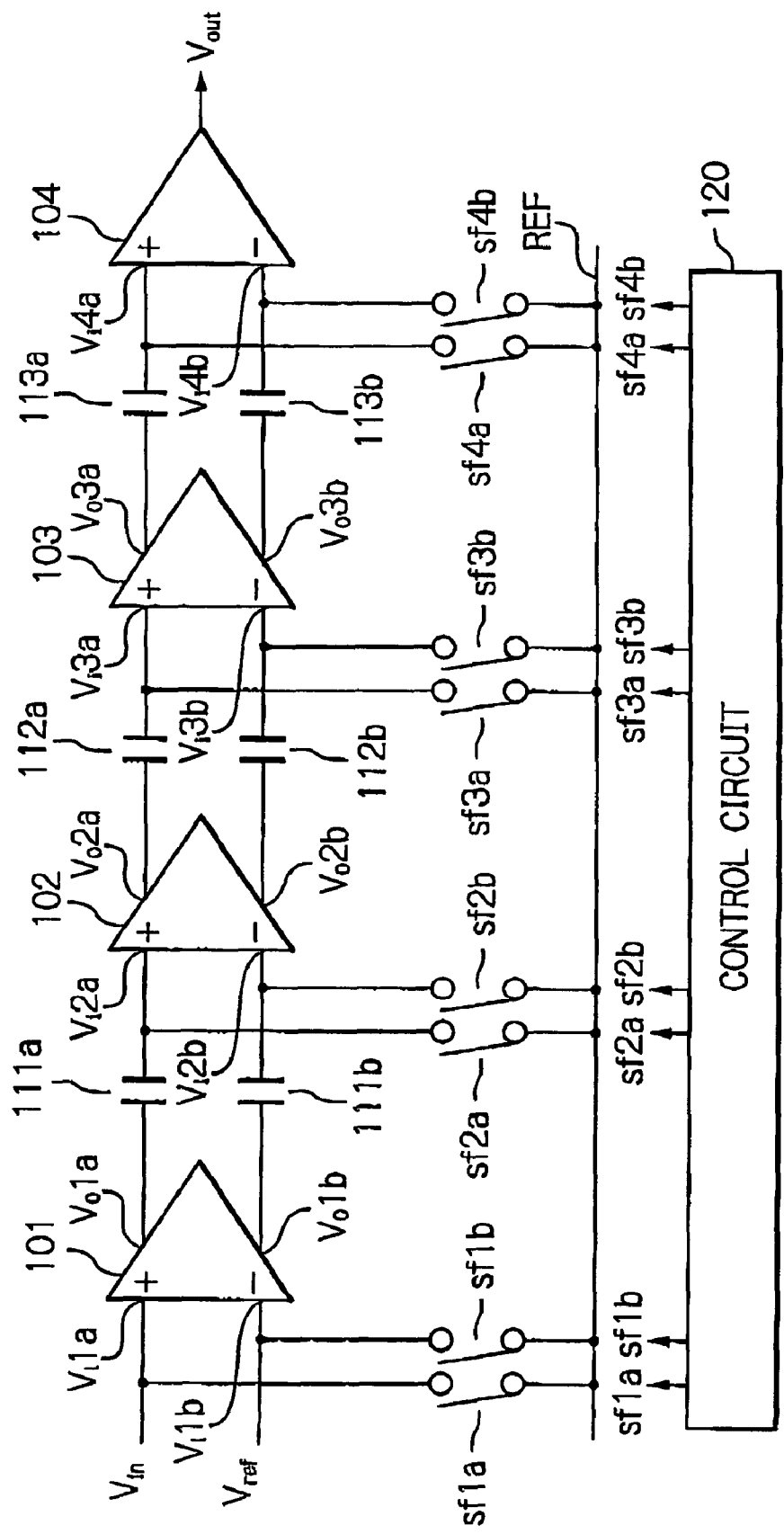
FIG. 3 is a circuit diagram of a first prior art comparator.
Figure 7:
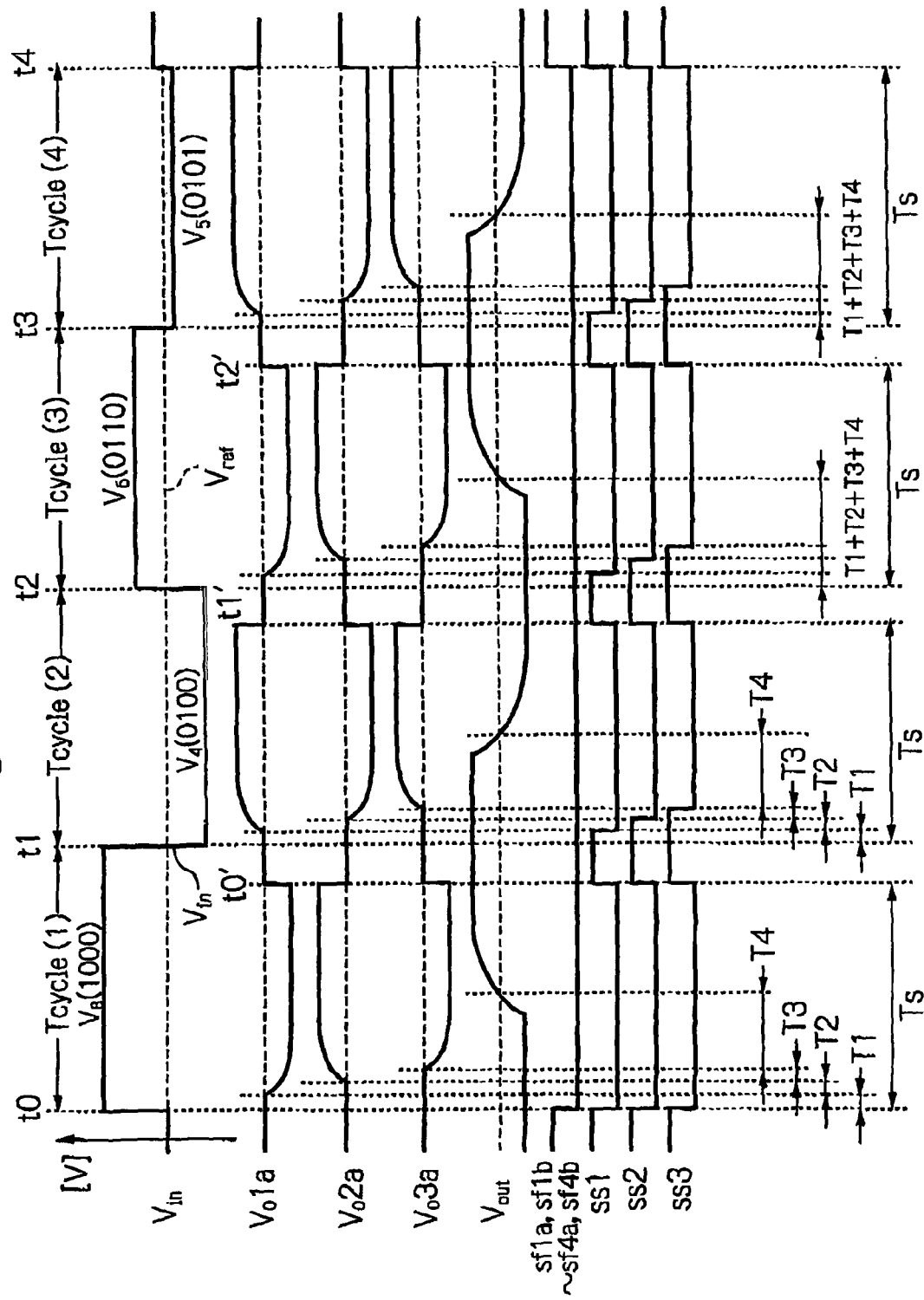
FIG. 7 is a timing diagram for explaining the operation of the comparator of FIG. 6.

In FIG. 3, which illustrates a first prior art comparator applied to the sequential successive approximation A/D converter of FIG. 1 (see: FIG. 7 of JP-10-200385A), differential amplifiers 101, 102, 103 and 104 are cascaded, i.e., connected in series by capacitors 111a, 111b, 112a, 112b, 113a and 113b. The differential amplifiers 101, 102 and 103 are fast ones of a two-input and two-output type with a low gain (amplification) and a low output impedance operable at a high speed, while the differential amplifier 104 is a slow one of a two-input and one-output type with a high gain (amplification) and a high output impedance operable at a low speed. Thus, the entirety of the differential amplifiers 101, 102, 103 and 104 can realize a high gain operable at a high speed.

In the fast differential amplifiers 101, 102 and 103, the relationship between the output voltages $V_o1a$, $V_o2a$ and $V_o3a$ and the output voltages $V_o1b$, $V_o2b$ and $V_o3b$ is opposite in phase to the relationship between the input voltages $V_i1a$, $V_i2a$ and $V_i3a$ and the input voltages $V_i1b$, $V_i2b$ and $V_i3b$. Also, in the slow differential amplifier 104, when $V_i4a > V_i4b$, the output voltage $V_{out}$ is high (=$V_{DD}$), and when $V_i4a \leqq V_i4b$, the output voltage $V_{out}$ is low (=GND).

The input ends of the differential amplifiers 101, 102, 103 and 104 are connected via switches sf1a, sf1b, sf2a, sf2b, sf3a, sf3b, sf4a and sf4b to a reference line REF. The switches sf1a, sf1b, sf2a, sf2b, sf3a, sf3b, sf4a and sf4b are controlled by a control circuit 120 so that the operating points of the input voltages of the differential amplifiers 101, 102, 103 and 104 can be at the reference voltage $V_{ref}$ before the comparison operations.

Figure 4:
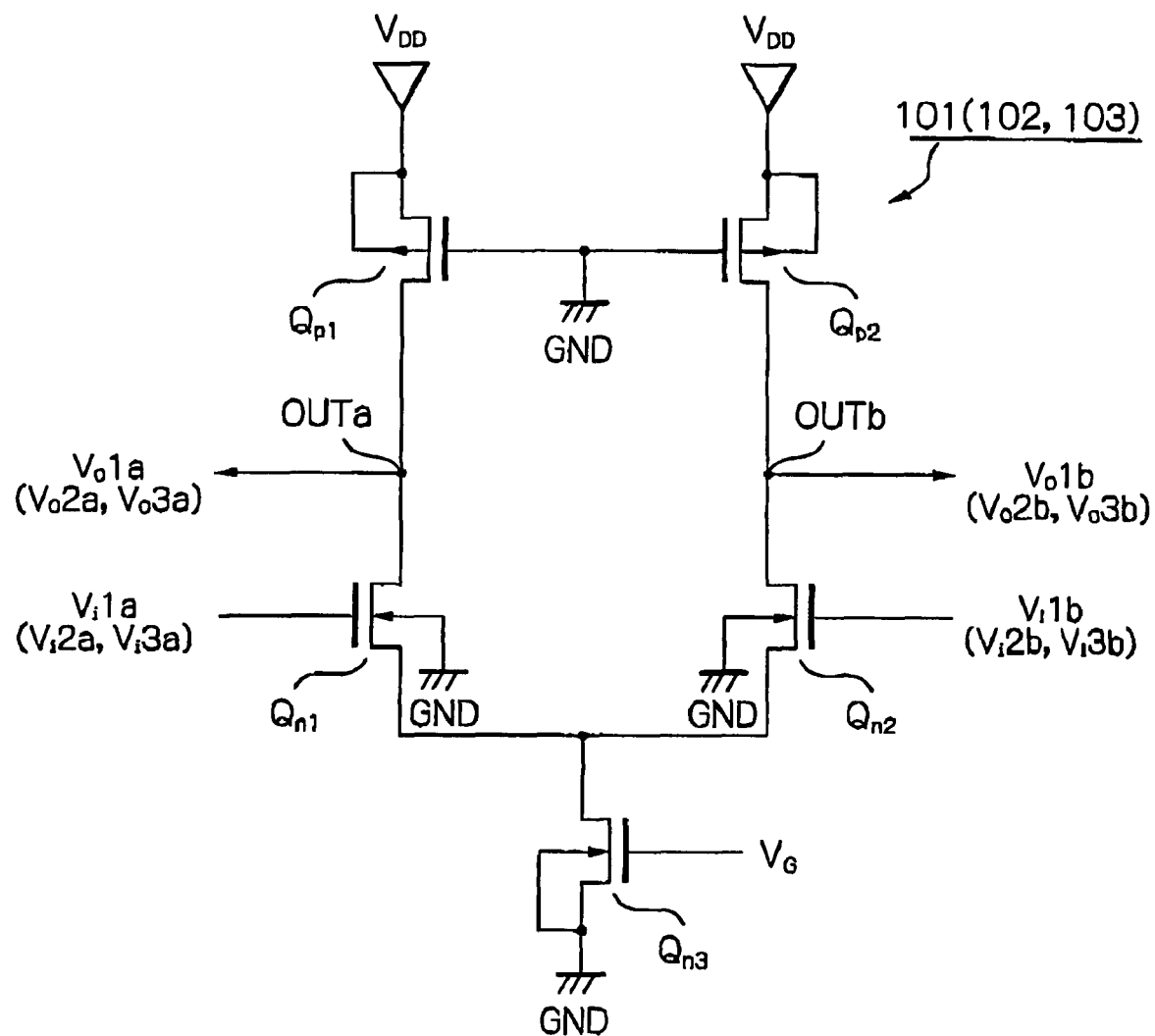
FIG. 4 is a detailed circuit diagram of the fast differential amplifier of FIG. 3.

In FIG. 4, which is a detailed circuit diagram of each of the fast differential amplifiers 101, 102 and 103 of FIG. 3, the fast differential amplifier 101 (102, 103) includes a differential pair formed by two n-channel MOS transistors $Q_{n1}$ and $Q_{n2}$, a constant current source formed by an n-channel MOS transistor $Q_{n3}$ with a definite gate voltage $V_G$ connected between a common source of the n-channel MOS transistors $Q_{n1}$ and $Q_{n2}$ and the ground terminal GND, and loads formed by source-to-gate connected p-channel MOS transistors $Q_{p1}$ and $Q_{p2}$ connected between the drains of the n-channel MOS transistors $Q_{n1}$ and $Q_{n2}$ and a power supply terminal $V_{DD}$. In this case, gates of the n-channel MOS transistors $Q_{n1}$ and $Q_{n2}$ receive the input voltages $V_i1a$ ($V_i2a$, $V_i3a$) and $V_i1b$ ($V_i2b$, $V_i3b$), while drains of the n-channel MOS transistors $Q_{n1}$ and $Q_{n2}$ or output terminals OUTa and OUTb generate the output voltages $V_o1a$ ($V_o2a$, $V_o3a$) and $V_o1b$ ($V_o2b$, $V_o3b$).

In the fast differential amplifier of FIG. 4, the gain $A_v$ and the output voltage $V_o$ (such as $V_o1a$) can be represented by $$A_v = g_m \cdot r$$

$$V_o = I_{out} \cdot r$$

where r is an output impedance at the output terminal OUTa;

$g_m$ is the mutual conductance of each of the transistors $Q_{n1}$ and $Q_{n2}$; and $I_{out}$ is a current flowing through the transistor $Q_{n1}$ or $Q_{n2}$.

Note that the differential amplifier 104 can be constructed by a single and differential amplifier with a high gain (amplification) and a high output impedance at a low speed.

Figure 5:
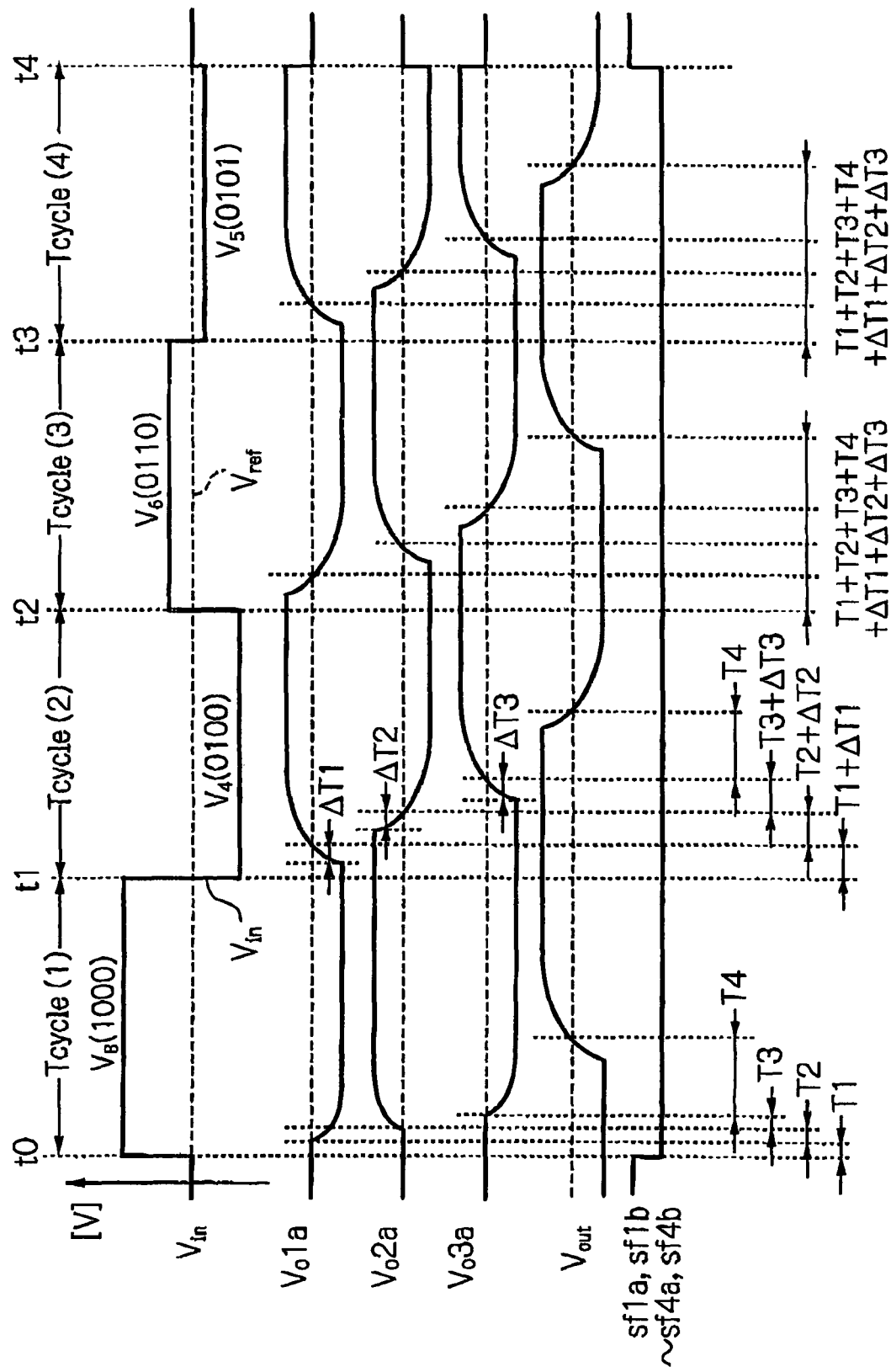
FIG. 5 is a timing diagram for explaining the operation of the comparator of FIG. 3.

The operation of the comparator of FIG. 3 is explained next with reference to FIG. 5. Even in this case, assume that the analog input voltage AIN is between $V_5$ (0101) and $V_6$ (0110) as shown in FIG. 2, and comparison operations are carried out four times with the value of the sequential approximation register 3 of FIG. 1 being 1000, 0100, 0110 and 1010.

Before time t0, the control circuit 120 turns ON all the switches sf1a, sf1b, sf2a, sf2b, sf3a, sf3b, sf4a and sf4b, so that the input voltages $V_i1a$, $V_i1b$, $V_i2a$, $V_i2b$, $V_i3a$, $V_i3b$, $V_i4a$ and $V_i4b$ of the differential amplifiers 101, 102, 103 and 104 are initialized to $V_{ref}$ (operating point).

At time t0, the control circuit 120 turns ON all the switches sf1a, sf1b, sf2a, sf2b, sf3a, sf3b, sf4a and sf4b, so that the input voltages $V_i1a$, $V_i2a$, $V_i3a$, and $V_i4a$ are separated from the input voltages $V_i1b$, $V_i2b$, $V_i3b$, and $V_i4b$, respectively.

Also, at time t0, the input voltage $V_{in}$ is caused to be $V_8$ (1000), so that the output voltages $V_o1a$, $V_o2a$, $V_o3a$ and $V_o4a$ of the differential amplifiers 101, 102, 103 and 104 are changed with delay time periods T1, T2, T3 and T4, respectively, determined by time constants determined by the capacitors 111a, 111b, 112a, 112b, 113a and 113b, the parasitic capacities and the like of the differential amplifiers 101, 102, 103 and 104. Therefore, in a time period $T_{cycle}$ (1), the total delay time T is $$T = T1 + T2 + T3 + T4.$$

Next, at time t1 after $T_{cycle}$ (1) has passed, the input voltage $V_{in}$ is switched from $V_8$ (1000) to $V_4$ (0100), so that the input voltage $V_{in}$ crosses the reference voltage $V_{ref}$. In this case, it will take return delay times ΔT1, ΔT2 and ΔT3 determined by the above-mentioned time constants for the output voltages $V_o1a$, $V_o2a$ and $V_o3a$ to return to $V_{ref}$ (operating point). Therefore, in a time period $T_{cycle}$ (2), the total delay time period T is $$T = T1 + T2 + T3 + T4 + \Delta T1 + \Delta T2 + \Delta T3.$$

Next, at time t2 after $T_{cycle}$ (2) has passed, the input voltage $V_{in}$ is switched from $V_4$ (0100) to $V_6$ (0110), so that the input voltage $V_{in}$ crosses the reference voltage $V_{ref}$. Even in this case, it will take return delay times ΔT1, ΔT2 and ΔT3 determined by the above-mentioned time constants for the output voltages $V_o1a$, $V_o2a$ and $V_o3a$ to return to $V_{ref}$ (operating point). Therefore, in a time period $T_{cycle}$ (3), the total delay time period T is $$T = T1 + T2 + T3 + T4 + \Delta T1 + \Delta T2 + \Delta T3.$$

Finally, at time t3 after $T_{cycle}$ (3) has passed, the input voltage $V_{in}$ is switched from $V_6$ (0110) to $V_5$ (0101), so that the input voltage $V_{in}$ crosses the reference voltage $V_{ref}$. Even in this case, it will take return delay times ΔT1, ΔT2 and ΔT3 determined by the above-mentioned time constants for the output voltages $V_o1a$, $V_o2a$ and $V_o3a$ to return to $V_{ref}$ (operating point). Therefore, in a time period $T_{cycle}$ (4), the total delay time period T is $$T = T1 + T2 + T3 + T4 + \Delta T1 + \Delta T2 + \Delta T3.$$

Thus, in the comparator of FIG. 3, the total delay time is increased by the return delay times ΔT1, ΔT2 and ΔT3 caused when the input voltage $V_{in}$ crosses the reference voltage $V_{ref}$. Also, since the operation speed of the fast differential amplifiers 101, 102 and 103 per se cannot be increased, the operation speed of the comparator cannot be increased.

Figure 6:
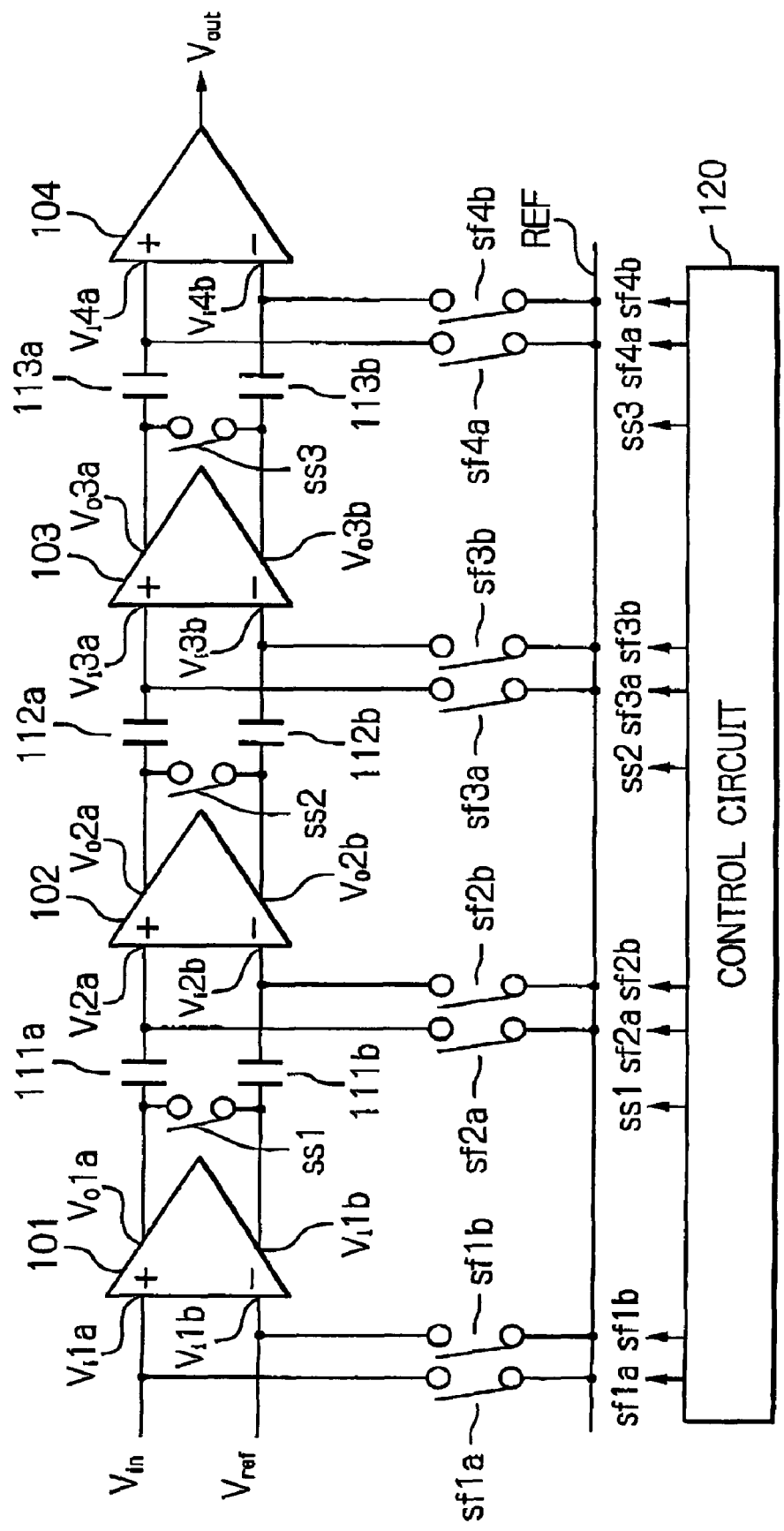
FIG. 6 is a circuit diagram of a second prior art comparator.

In FIG. 6, which illustrates a second prior art comparator applied to the sequential successive approximation A/D converter of FIG. 1 (see; FIGS. 1 and 2 of JP-10-200385A), switches ss1, ss2 and ss3 are added to the output ends of the fast differential amplifiers 101, 102 and 103, respectively, of FIG. 3. The switches ss1, ss2 and ss3 are also controlled by the control circuit 120.

The operation of the comparator of FIG. 6 is explained next with reference to FIG. 7. Even in this case, assume that the analog input voltage AIN is between $V_5$ (0101) and $V_6$ (0110) as shown in FIG. 2, and comparison operations are carried out four times with the value of the sequential approximation register 3 of FIG. 1 being 1000, 0100, 0110 and 1010.

Before time t0, the control circuit 120 turns ON all the switches sf1a, sf1b, sf2a, sf2b, sf3a, sf3b, sf4a, sf4b, ss1, ss2 and ss3 so that the input voltages $V_i1a$, $V_i1b$, $V_i2a$, $V_i2b$, $V_i3a$, $V_i3b$, $V_i4a$ and $V_i4b$ of the differential amplifiers 101, 102, 103 and 104 are initialized to $V_{ref}$ (operating point), and also, the output voltages $V_o1a$, $V_o1b$, $V_o2a$, $V_o2b$, $V_o3a$ and $V_o3b$ of the differential amplifiers 101, 102 and 103 are initialized to their operating points.

At time t0, the control circuit 120 turns ON all the switches sf1a, sf1b, sf2a, sf2b, sf3a, sf3b, sf4a, sf4b, ss1, ss2 and ss3, so that the input voltages $V_i1a$, $V_i2a$, $V_i3a$, and $V_i4a$ are separated from the input voltages $V_i1b$, $V_i2b$, $V_i3b$, and $V_i4b$, respectively.

Also, at time t0, the input voltage $V_{in}$ is caused to be $V_8$ (1000), so that the output voltages $V_o1a$, $V_o2a$, $V_o3a$ and $V_o4a$ of the differential amplifiers 101, 102, 103 and 104 are changed with delay time periods T1, T2, T3 and T4, respectively, determined by time constants determined by the capacitors 111a, 111b, 112a, 112b, 113a and 113b, the parasitic capacities and the like of the differential amplifiers 101, 102, 103 and 104. Therefore, in a time period $T_{cycle}$ (1), the total delay time T is $T=T1+T2+T3+T4.$ Next, at time t0' after a stable time period $T_s$ (>T1+T2+T3+T4) has passed, the control circuit 120 turns ON the switches ss1, ss2 and ss3, so that the output voltages $V_o1a$, $V_o1b$, $V_o2a$, $V_o2b$, $V_o3a$ and $V_o3b$ are initialized or reset to their operating points. Note that the stable time period $T_s$ is determined so that the output voltage $V_{out}$ can surely be established.

Next, at time t1 after $T_{cycle}$ (1) has passed, the input voltage $V_{in}$ is switched from $V_8$ (1000) to $V_4$ (0100), so that the input voltage $V_{in}$ crosses the reference voltage $V_{ref}$. Then, the control circuit 120 sequentially turns OFF the switches ss1, ss2 and ss3. In this case, no return delay tires ΔT1, ΔT2 and ΔT3 of FIG. 5 for the output voltages $V_o1a$, $V_o2a$ and $V_o3a$ are required. Therefore, in a time period $T_{cycle}$ (2), the total delay time period T is $T=T1+T2+T3+T4.$ Next, at time t1' after a stable time period $T_s$ has passed, the control circuit 120 turns ON the switches ss1, ss2 and ss3, so that the output voltages $V_o1a$, $V_o1b$, $V_o2a$, $V_o2b$, $V_o3a$ and $V_o3b$ are initialized or reset to their operating points.

Next, at time t2 after $T_{cycle}$ (2) has passed, the input voltage $V_{in}$ is switched from $V_4$ (0100) to $V_6$ (0110), so that the input voltage $V_{in}$ crosses the reference voltage $V_{ref}$. Then, the control circuit 120 sequentially turns OFF the switches ss1, ss2 and ss3. Even in this case, no return delay times ΔT1, ΔT2 and ΔT3 of FIG. 5 for the output voltages $V_o1a$, $V_o2a$ and $V_o3a$ are required. Therefore, in a time period $T_{cycle}$ (3), the total delay time period T is $T=T1+T2+T3+T4.$ Next, at time t2' after a stable time period $T_s$ has passed, the control circuit 120 turns ON the switches ss1, ss2 and ss3, so that the output voltages $V_o1a$, $V_o1b$, $V_o2a$, $V_o2b$, $V_o3a$ and $V_o3b$ are initialized or reset to their operating points.

Finally, at time t3 after $T_{cycle}$ (3) has passed, the input voltage $V_{in}$ is switched from $V_6$ (0110) to $V_5$ (0101), so that the input voltage $V_{in}$ crosses the reference voltage $V_{ref}$. Then, the control circuit 120 sequentially turns OFF the switches ss1, ss2 and ss3. Even in this case, no return delay times ΔT1, ΔT2 and ΔT3 of FIG. 5 for the output voltages $V_o1a$, $V_o2a$ and $V_o3a$ are required. Therefore, in a time period $T_{cycle}$ (4), the total delay time period T is $T=T1+T2+T3+T4.$ Thus, in the comparator of FIG. 6, the total delay time is not increased, even when the input voltage $V_{in}$ crosses the reference voltage $V_{ref}$.

In the comparator of FIG. 6, however, in order to surely transmit the transition of the input voltage $V_{in}$ to the output voltage $V_{out}$, the transition timing of the output voltages of each of the differential amplifiers 101, 102 and 103 is determined by the OFF timings of the switches ss1, ss2 and ss3, respectively. Therefore, since the OFF timings of the switches ss1, ss2 and ss3 must be determined in view of the maximum values of the delay time periods T1, T2, T3 and T4, the stable time period $T_s$ is not always short, so that the total delay time T is not always decreased.

Also, in the comparator of FIG. 6, in order to amplify a small difference in voltage, each of the fast differential amplifiers 101, 102 and 103 needs to have some amplification, so that the output impedance of each of the fast differential amplifiers 101, 102 and 103 needs to have some value. Therefore, some delay would be generated in rising and falling of signals, so that a transmission delay time is required for the difference in voltage generated by one fast differential amplifier to transmit to the difference in output voltage in the next stage differential amplifier. Thus, it is impossible to decrease the total delay time, which would exhibit a remarkably-adverse effect in the overall high speed comparison operations. Additionally, since the operation speed of the fast amplifiers 101, 102 and 103 per se cannot be increased, the operation speed of the comparator cannot be increased.

Figure 8:
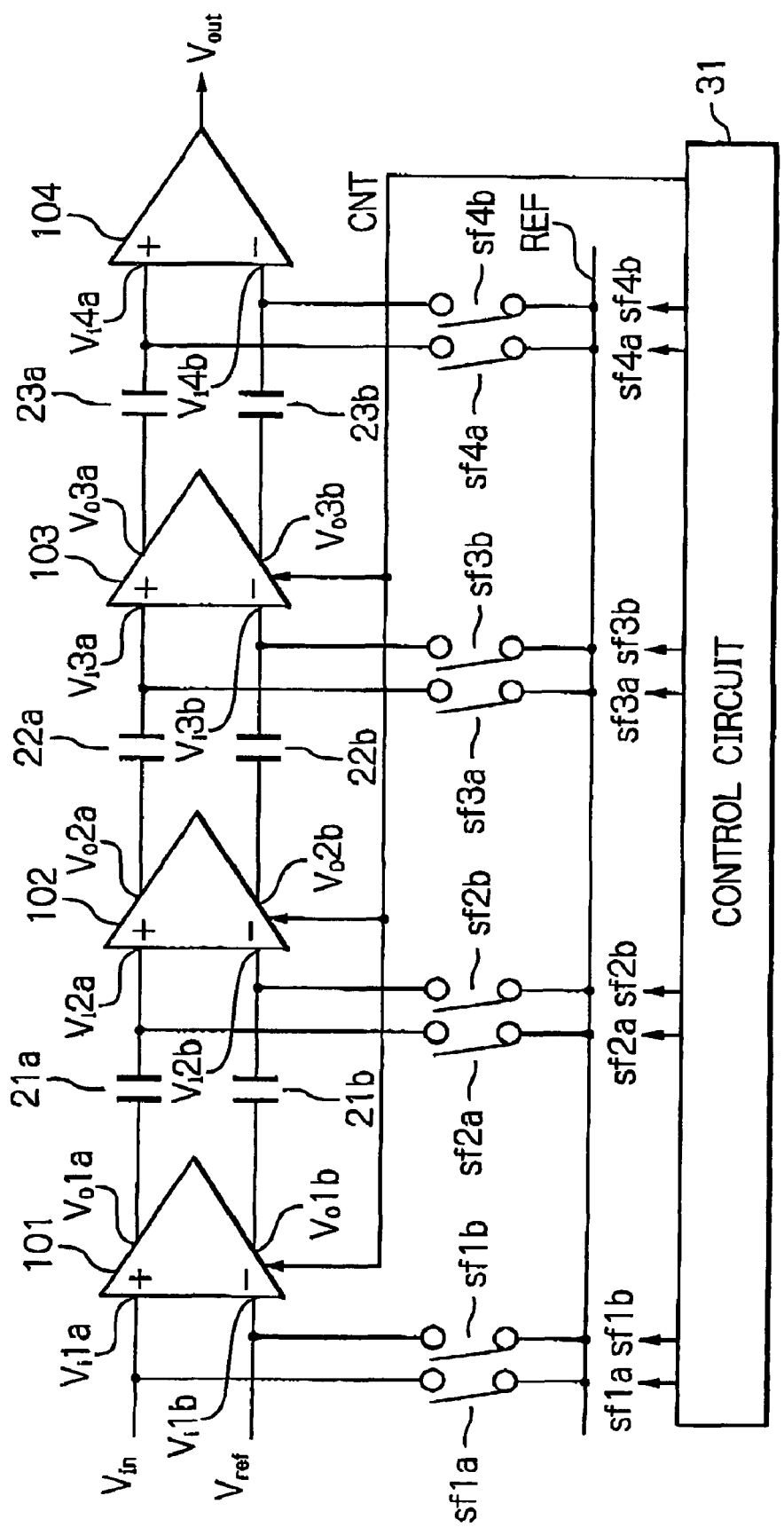
FIG. 8 is a circuit diagram of a comparator including an embodiment of the fast/super fast amplifier according to the present invention.

In FIG. 8, which illustrates a comparator including an embodiment of the amplifier according to the present invention, applied to the sequential successive approximation A/D converter of FIG. 1, differential amplifiers 11, 12, 13 and 14 are connected in series by capacitors 21a, 21b, 22a, 22b, 23a and 23b. The differential amplifiers 11, 12 and 13 according to the present invention are fast/super fast ones of a two-input and two-output type with a controllable gain (amplification) and a controllable output impedance operable at a controllable speed, while the differential amplifier 14 is of a two-input and one-output type with a high gain (or amplification) and a high output impedance operable at a low speed. Thus, the entirety of the differential amplifiers 11, 12, 13 and 14 can realize a high gain operable at a high speed.

In the fast/super fast differential amplifiers 11, 12 and 13, the relationship between the output voltages $V_o1a$, $V_o2a$ and $V_o3a$ and the output voltages $V_o1b$, $V_o2b$ and $V_o3b$ is opposite in phase to the relationship between the input voltages $V_i1a$, $V_i2a$ and $V_i3a$ and the input voltages $V_i1b$, $V_i2b$ and $V_i3b$. Also, in the differential amplifier 14, when $V_i4a>V_i4b$, the output voltage $V_{out}$ is high (=$V_{DD}$), and when $V_i4a \leq V_i4b$, the output voltage is low (=GND).

The input ends of the differential amplifiers 11, 12, 13 and 14 are connected via switches sf1a, sf1b, sf2a, sf2b, sf3a, sf3b, sf4a and sf4b to a reference line REF. The switches sf1a, sf1b, sf2a, sf2b, sf3a, sf3b, sf4a and sf4b are controlled by a control circuit 31 so that the operating points of the input voltages of the differential amplifiers 11, 12, 13 and 14 can be at the reference voltage $V_{ref}$ before the comparison operations.

As stated above, the slow differential amplifier 14, which corresponds to the slow differential amplifier 104 of FIGS. 3 and 6, always has a high amplification (gain) and a high output impedance. That is, when the input voltage $V_i4a$ is lower than the input voltage $V_i4b$, the difference therebetween is amplified with a high amplification, so that the output voltage $V_{out}$ is high, for example, $V_{DD}$. On the other hand; when the input voltage $V_i4a$ is higher than the input voltage $V_i4b$, the difference therebetween is amplified with a low amplification, so that the output voltage $V_{out}$ is low, for example, GND.

The control circuit 31 generates an amplification and output impedance control signal CNT and transmits it to the fast/super fast differential amplifiers 11, 12 and 13, so that the amplification and output impedance of the fast/super fast differential amplifiers 11, 12 and 13 are controlled.

Note that the comparator of FIG. 8 is integrated into a semiconductor substrate.

Figure 9:
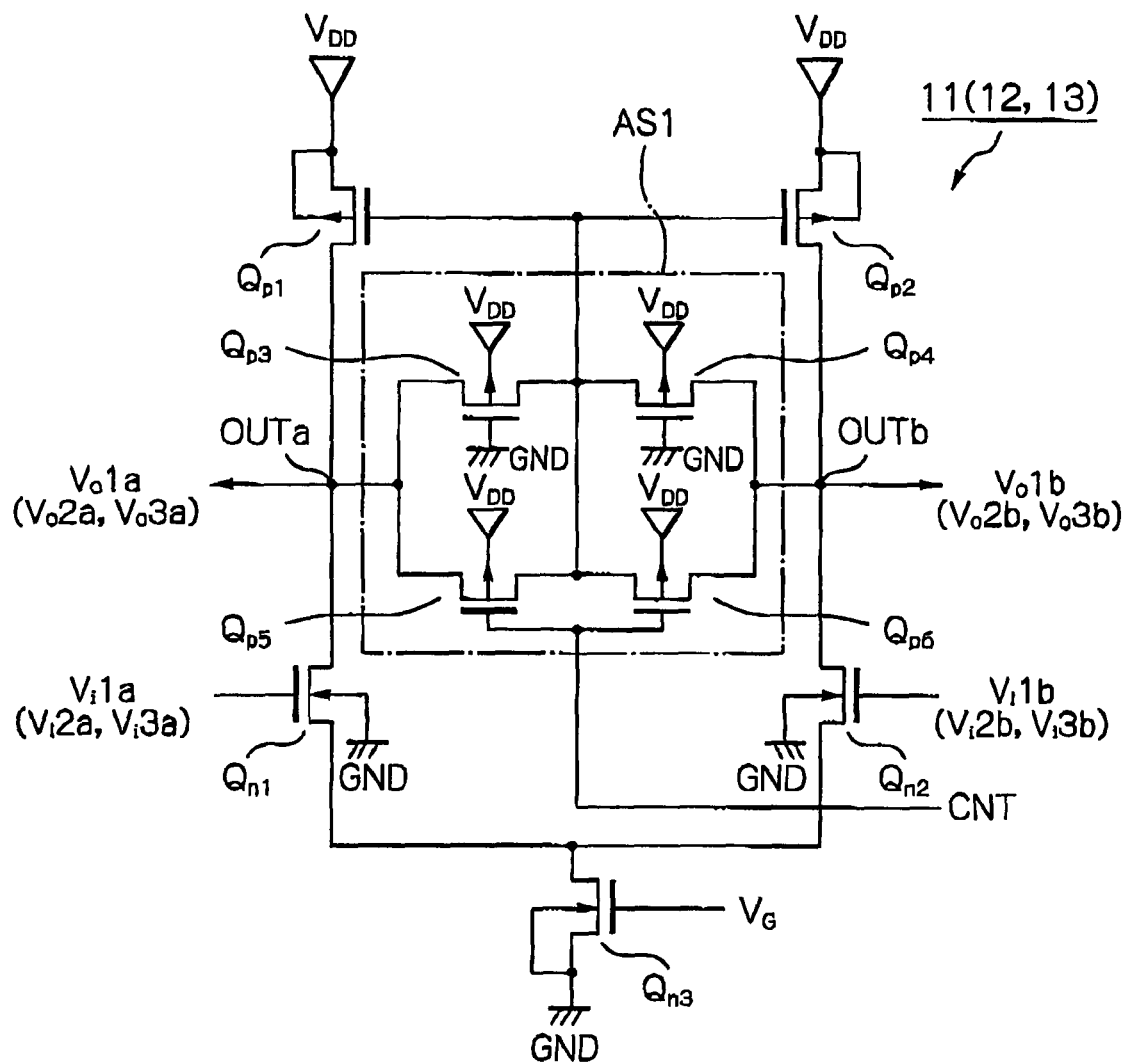
FIG. 9 is a detailed circuit diagram of a first example of the fast/super fast differential amplifier of FIG. 8.

In FIG. 9, which illustrates a first example of each of the differential amplifiers 11, 12 and 13 of FIG. 8, an amplification and output impedance switching circuit AS1 formed by p-channel MOS transistors $Q_{p3}$, $Q_{p4}$, $Q_{p5}$ and $Q_{p6}$ is added to the elements of FIG. 4.

The p-channel MOS transistors $Q_{p3}$ and $Q_{p4}$ forming a first resistance circuit are connected in series between output terminals OUTa and OUTb. The gates of the p-channel MOS transistors $Q_{p3}$ and $Q_{p4}$ are connected to the ground terminal GND, while the backgates of the p-channel MOS transistors $Q_{p3}$ and $Q_{p4}$ are connected to the power supply terminal $V_{DD}$. The connection point between the p-channel MOS transistors $Q_{p3}$ and $Q_{p4}$ is connected to the gates of the p-channel MOS transistors $Q_{p1}$ and $Q_{p2}$. Since the gates of the p-channel MOS transistors $Q_{p3}$ and $Q_{p4}$ are grounded, each of the p-channel MOS transistors $Q_{p3}$ and $Q_{p4}$ serves as a constant resistance.

The p-channel MOS transistors $Q_{p5}$ and $Q_{p6}$ forming a second resistance circuit are connected in series between the output terminals OUTa and OUTb. The gates of the p-channel MOS transistors $Q_{p5}$ and $Q_{p6}$ receive the amplification and output impedance control signal CNT, while the backgates of the p-channel MOS transistors $Q_{p5}$ and $Q_{p6}$ are connected to the power supply terminal $V_{DD}$. The connection point between the p-channel MOS transistors $Q_{p5}$ and $Q_{p6}$ is connected to the gates of the p-channel MOS transistors $Q_{p1}$ and $Q_{p2}$. Since the gates of the p-channel MOS transistors $Q_{p5}$ and $Q_{p6}$ are controlled by the amplification and output impedance control signal CNT, each of the p-channel MOS transistors $Q_{p3}$ and $Q_{p4}$ serves as a variable resistance. For example, when the voltage of the amplification and output impedance control signal CNT is $V_{DD}$, the variable resistance has a substantially infinite value. Also, when the voltage of the amplification and output impedance control signal CNT is GND, the variable resistance is substantially zero.

Note that the size of the p-channel MOS transistor $Q_{p3}$ is preferably the same as that of the p-channel MOS transistor $Q_{p4}$, so that the resistance value of the p-channel MOS transistor $Q_{p3}$ is substantially the same as that of the p-channel MOS transistor $Q_{p4}$. In this case, the voltages at the gates of the p-channel MOS transistors $Q_{p1}$ and $Q_{p2}$ are maintained at the operating points of the output voltages $V_o1a$ and $V_o1b$ ($V_o2a$ and $V_o2b$, $V_o3a$ and $V_o3b$). Similarly, the size of the p-channel MOS transistor $Q_{p6}$ is preferably the same as that of the p-channel MOS transistor $Q_{p6}$, so that the resistance value of the p-channel MOS transistor $Q_{p5}$ is substantially the same as that of the p-channel MOS transistor $Q_{p6}$.

The operation of the fast/super fast differential amplifier of FIG. 9 is explained below.

When the amplification and output impedance control signal CNT indicates a high voltage such as $V_{DD}$, the fast/super fast differential amplifier serves as a fast differential amplifier having a first amplification and a first output impedance operable at a fast speed. That is, the p-channel MOS transistors $Q_{p5}$ and $Q_{p6}$ are turned OFF, so that the output impedance is determined by a combined resistance of the p-channel MOS transistors $Q_{p1}$, $Q_{p2}$, $Q_{p3}$ and $Q_{p4}$.

On the other hand, when the amplification and output impedance control signal CNT indicates a low voltage such as GND, the fast/super fast differential amplifier serves as a super fast differential amplifier having a second amplification smaller than the first amplification and a second output impedance smaller than the first output impedance operable at a super fast speed. That is, the p-channel MOS transistors $Q_{p5}$ and $Q_{p6}$ are turned ON, so that the output impedance is determined by a combined resistance of the p-channel MOS transistors $Q_{p1}$, $Q_{p2}$, $Q_{p3}$, $Q_{p4}$, $Q_{p5}$ and $Q_{p6}$.

Thus, when the amplification and output impedance control signal CNT indicates a high voltage, the first output impedance is combined with the next stage capacitance to form a first time constant, so that the difference between the input voltages $V_i1a$ ($V_i2a$, $V_i3a$) and $V_i1b$ ($V_i2b$, $V_i3b$) is amplified by the first amplification at a fast speed depending upon the first time constant. On the other hand, when the amplification and output impedance control signal CNT indicates a low voltage, the second output impedance is combined with the next stage capacitance to form a second time constant, so that the difference between the input voltages $V_i1a$ ($V_i2a$, $V_i3a$) and $V_i1b$ ($V_i2b$, $V_i3b$) is amplified by the second amplification at a super fast speed depending upon the second time constant.

In summary, if the differential amplifier of FIG. 9 has a low gain (amplification) and a low output impedance operable at a high speed under CNT=$V_{DD}$, the differential amplifier of FIG. 9 has a much lower gain (much lower amplification) and a much lower output impedance operable at a much higher speed under CNT=GND.

Figure 10:
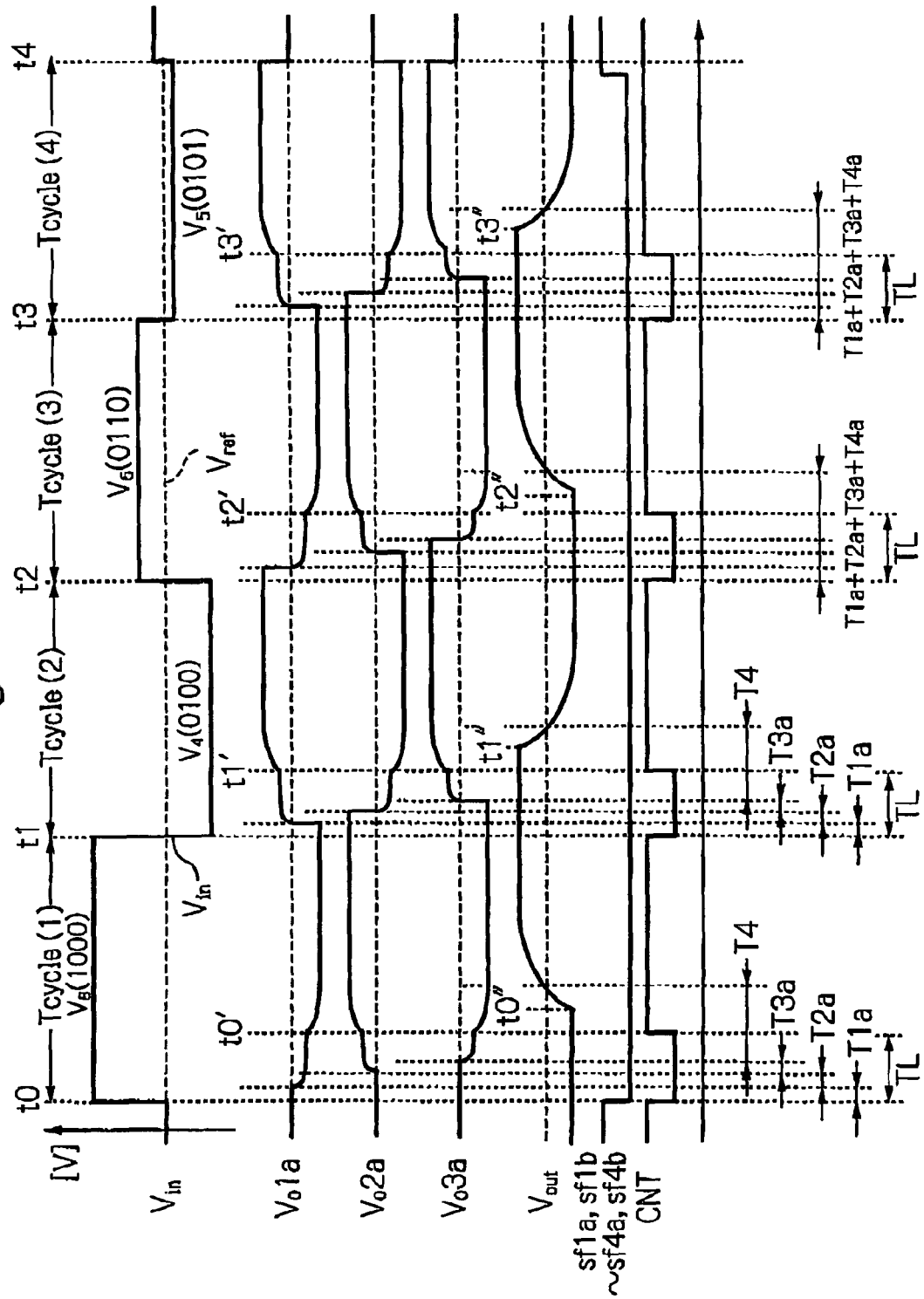
FIG. 10 is a timing diagram for explaining the operation of the comparator of FIG. 8.

The operation of the comparator of FIG. 8 is explained next with reference to FIG. 10. Even in this case, assume that the analog input voltage AIN is between $V_6$ (0101) and $V_6$ (0110) as shown in FIG. 2, and comparison operations are carried out four times with the value of the sequential approximation register 3 of FIG. 1 being 1000, 0100, 0110 and 1010.

Before time t0, the control circuit 31 turns ON all the switches sf1a, sf1b, sf2a, sf2b, sf3a, sf3b, sf4a and sf4b, so that the input voltages $V_i1a$, $V_i1b$, $V_i2a$, $V_i2b$, $V_i3a$, $V_i3b$, $V_i4a$ and $V_i4b$ of the differential amplifiers 101, 102, 103 and 104 are initialized to $V_{ref}$ (operating point). Also, the control circuit 31 makes the amplification and output impedance control signal CNT high (=$V_{DD}$), so that the fast/super fast differential amplifiers 11, 12 and 13 are in a fast speed mode. That is, each of the differential amplifiers 11, 12 and 13 serves as a fast differential amplifier having a low gain (amplification) and a low output impedance operable at a fast speed.

At time t0, the control circuit 31 turns ON all the switches sf1a, sf1b, sf2a, sf2b, sf3a, sf3b, sf4a and sf4b, so that the input voltages $V_i1a$, $V_i2a$, $V_i3a$, and $V_i4a$ are separated from the input voltages $V_i1b$, $V_i2b$, $V_i3b$, and $V_i4b$, respectively. Simultaneously, the control circuit 31 makes the amplification and output impedance control signal CNT low (=GND), so that the fast/super fast differential amplifiers 11, 12 and 13 enter a super fast speed mode defined by a time period TL. That is, each of the fast/super fast differential amplifiers 11, 12 and 13 serves a super fast differential amplifier having a much lower gain (amplification) and a much lower output impedance operable at a super fast speed.

Also, at time t0, the input voltage $V_{in}$ is caused to be $V_8$ (1000), so that the output voltages $V_o1a$, $V_o2a$ and $V_o3a$ of the differential amplifiers 11, 12 and 13 are rapidly changed with delay time periods T1a, T2a and T3a, respectively, in accordance with time constants substantially determined by the parasitic capacities and the like within the differential amplifiers 11, 12 and 13. Therefore, when the delay time period T1a has passed, the output voltages $V_o1a$ of the differential amplifier 11 is changed to reach a predetermined level. Then, when the delay time period T3a has passed, the output voltage $V_o3a$ of the differential amplifier 13 is changed to reach a predetermined level. As a result, the output voltage $V_{out}$ of the slow differential amplifier 14 is changed with a delay time period T4 in accordance with a time constant determined by the parasitic capacitance and the like of the differential amplifier 14. Therefore, after the delay time period T4 has passed, the output voltage $V_{out}$ of the differential amplifier 14 is changed and is finally brought close to $V_{DD}$ or GND at time t1.

Next, at time t0' after the super fast mode time period TL formed by T1a, T2a and T3a (TL>T1a+T2a+T3a) has passed, the control circuit 31 makes the amplification and output impedance control signal CNT high (=$V_{DD}$), so that the fast/super fast differential amplifiers 11, 12 and 13 return to a fast mode. In this case, the time t0' is set before time t0" when the output voltage $V_{out}$ of the slow differential amplifier 14 starts to change.

Note that the super fast mode time period TL generally satisfies the following:

$TL<T1+T2+T3+\Delta T1+\Delta T2+\Delta T3$ where T1, T2 and T3 (see: FIG. 5) are delay time periods of the differential amplifiers 11, 12 and 13 serving as fast differential amplifiers; and $\Delta T1$, $\Delta T2$ and $\Delta T3$ (see: FIG. 5) are return delay time periods of the differential amplifiers 11, 12 and 13 serving as fast differential amplifiers. Therefore, in a time period $T_{cycle}$ (1), the total delay time T is $T=T1a+T2a+T3a+T4$.

Next, at time t1 after $T_{cycle}$ (1) has passed, the input voltage $V_{in}$ is switched from $V_8$ (1000) to $V_4$ (0100), so that the input voltage $V_{in}$ crosses the reference voltage $V_{ref}$. In this case, the control circuit 31 makes the amplification and output impedance control signal CNT low (=GND), so that the differential amplifiers 11, 12 and 13 enter a super fast mode defined by a super fast time period TL. As a result, no return delay times $\Delta T1$, $\Delta T2$ and $\Delta T3$ of FIG. 5 for the output voltages $V_{c1}1a$, $V_o2a$ and $V_o3a$ are required. Therefore, in a time period $T_{cycle}$ (2), the total delay time period T is $T=T1a+T2a+T3a+T4$.

Next, at time t2 after $T_{cycle}$ (2) has passed, the input voltage $V_{in}$ is switched from $V_4$ (0100) to $V_6$ (0110), so that the input voltage $V_{in}$ crosses the reference voltage $V_{ref}$. Even in this case, since the differential amplifiers 11, 12 and 13 have entered a super fast mode, no return delay times $\Delta T1$, $\Delta T2$ and $\Delta T3$ of FIG. 5 for the output voltages $V_o1a$, $V_o2a$ and $V_o3a$ are required. Therefore, in a time period $T_{cycle}$ (3), the total delay time period T is $T=T1a+T2a+T3a+T4$.

Finally, at time t3 after $T_{cycle}$ (3) has passed, the input voltage $V_{in}$ is switched from $V_6$ (0110) to $V_5$ (0101), so that the input voltage $V_{in}$ crosses the reference voltage $V_{ref}$. Even in this case, since the differential amplifiers 11, 12 and 13 have entered a super fast modes no return delay times $\Delta T1$, $\Delta T2$ and $\Delta T3$ of FIG. 5 for the output voltages $V_o1a$, $V_o2a$ and $V_o3a$ are required. Therefore, in a time period $T_{cycle}$ (4), the total delay time period T is $T=T1a+T2a+T3a+T4$.

Thus, in the comparator of FIG. 8, the total delay time is not increased, even when the input voltage $V_{in}$ crosses the reference voltage $V_{ref}$. Also, since the speed of transmission of signals per se is increased by a super fast mode of the differential amplifiers 11, 12 and 13, the speed of transmission of signals can be increased as compared with the second prior art comparator of FIG. 6.

Figure 11:
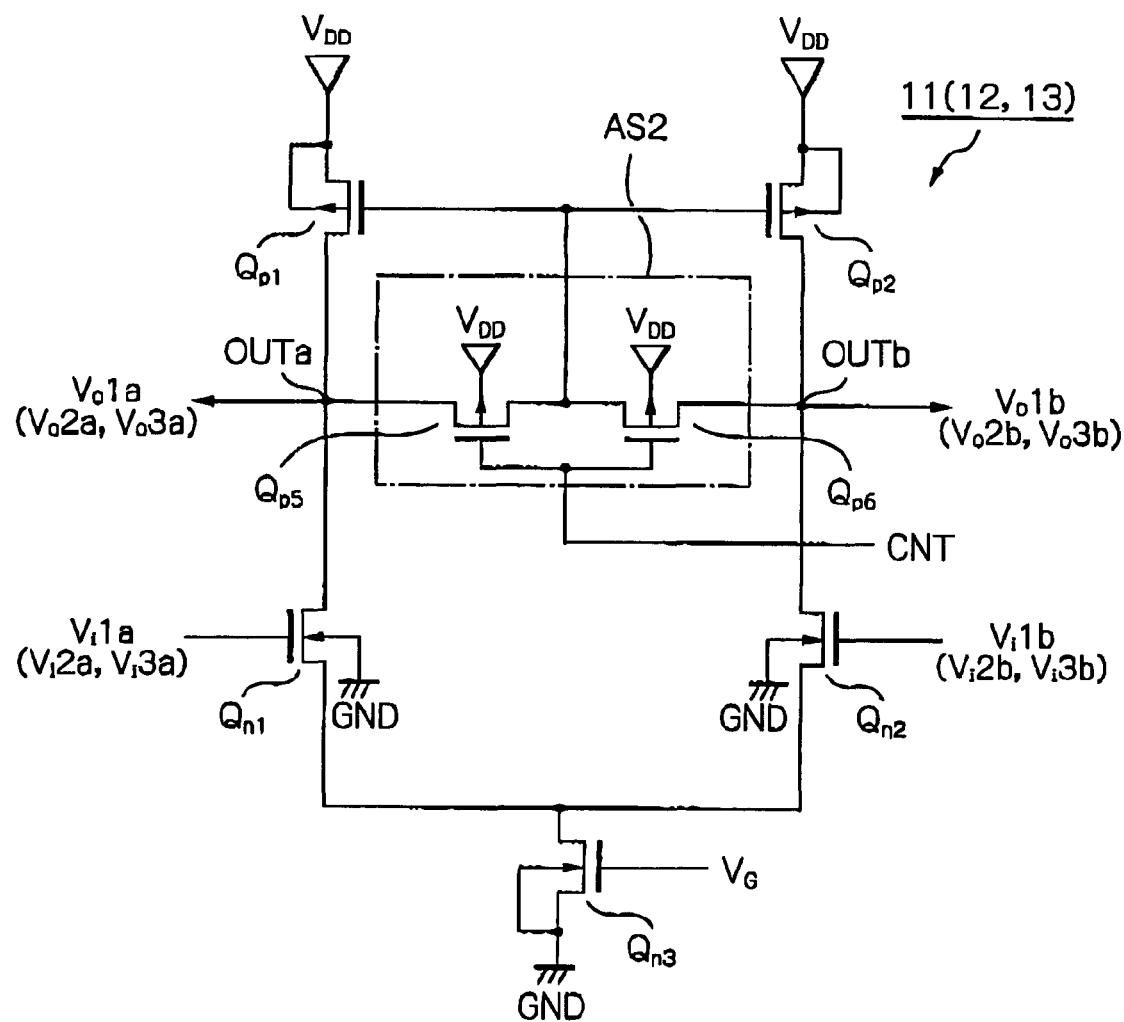
FIG. 11 is a detailed circuit diagram of a second example of the fast/super fast differential amplifier of FIG. 8.

In FIG. 11, which illustrates a second example of the fast/super fast differential amplifiers 11, 12 and 13 of FIG. 8, the amplification and output impedance switching circuit AS1 of FIG. 9 is replaced by an amplification and output impedance switching circuit AS2 where the p-channel MOS transistors $Q_{p3}$ and $Q_{p4}$ of FIG. 9 are removed. For example, when the voltage of the amplification and output impedance control signal CNT is $V_{DD}$, each of the p-channel MOS transistors $Q_{p5}$ and $Q_{p6}$ has a substantially infinite resistance value. Also, when the voltage of the amplification and output impedance control signal CNT is GND+α where α is a small positive value, each of the p-channel MOS transistors $Q_{p6}$ and $Q_{p6}$ has a predetermined resistance value. Thus, the amplification and output impedance switching circuit AS2 is operated in the same way as the amplification and output impedance switching circuit AS1 of FIG. 9.

Figure 12:
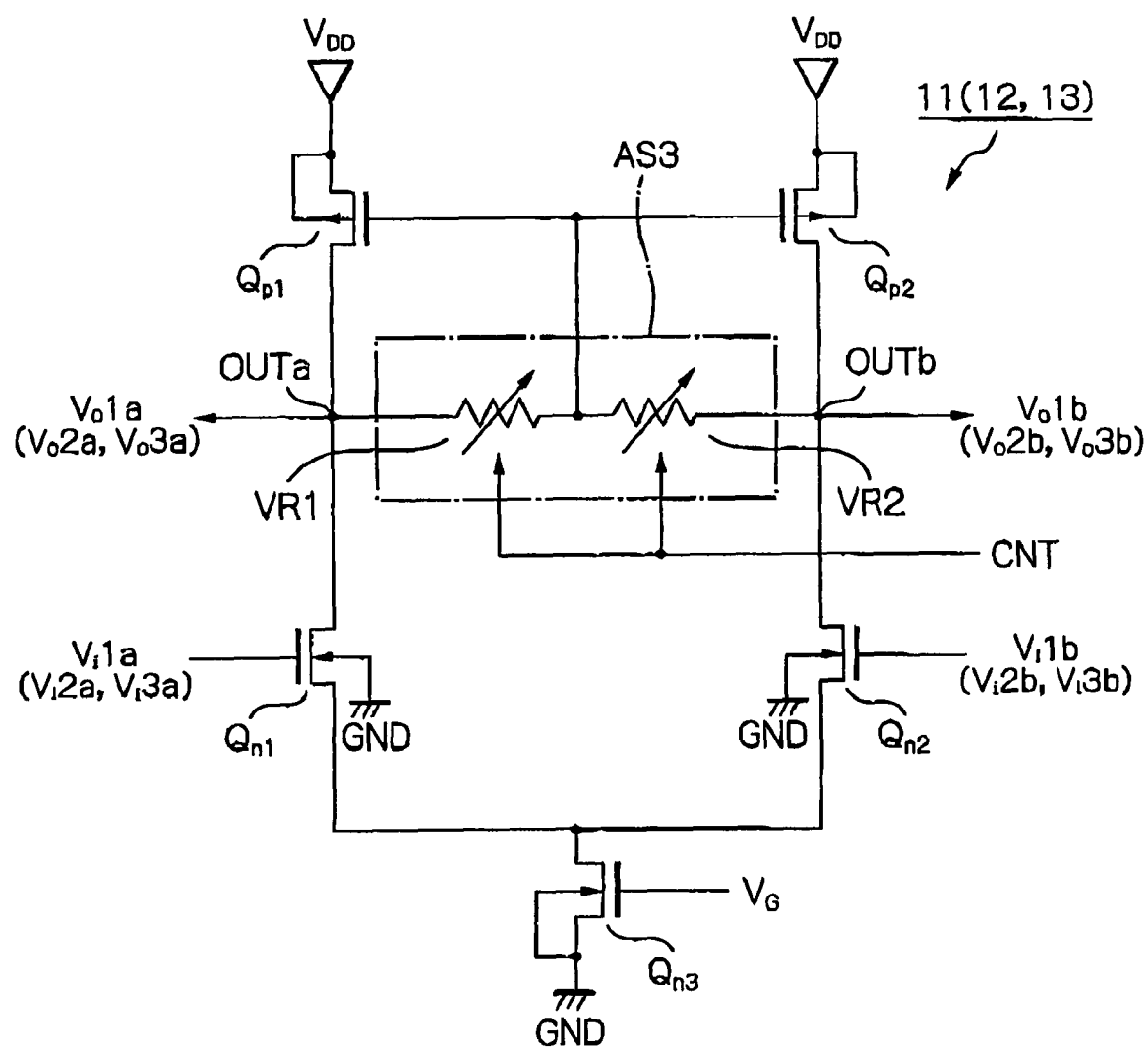
FIG. 12 is a detailed circuit diagram of a third example of the fast/super fast differential amplifier of FIG. 8.

In FIG. 12, which illustrates a third example of the fast/super fast differential amplifiers 11, 12 and 13 of FIG. 8, the amplification and output impedance switching circuit AS2 of FIG. 11 is replaced by an amplification and output impedance switching circuit AS3 where the p-channel MOS transistors $Q_{p5}$ and $Q_{p6}$ of FIG. 11 are replaced by variable resistors VR1 and VR2. For example, when the voltage of the amplification and output impedance control signal CNT is $V_{DD}$, each of the variable resistors VR1 and VR2 has a substantially infinite resistance value. Also, when the voltage of the amplification and output impedance control signal CNT is GND, each of the variable resistors VR1 and VR2 has a predetermined resistance value. Thus, the amplification and output impedance switching circuit AS3 is operated in the same way as the amplification and output impedance switching circuit AS1 of FIG. 9. In FIG. 12, note that the variable resistors VR1 and VR2 have the same value in order to suppress the fluctuation of gate voltages of the p-channel MOS transistors $Q_{p1}$ and $Q_{p2}$.

Figure 13:
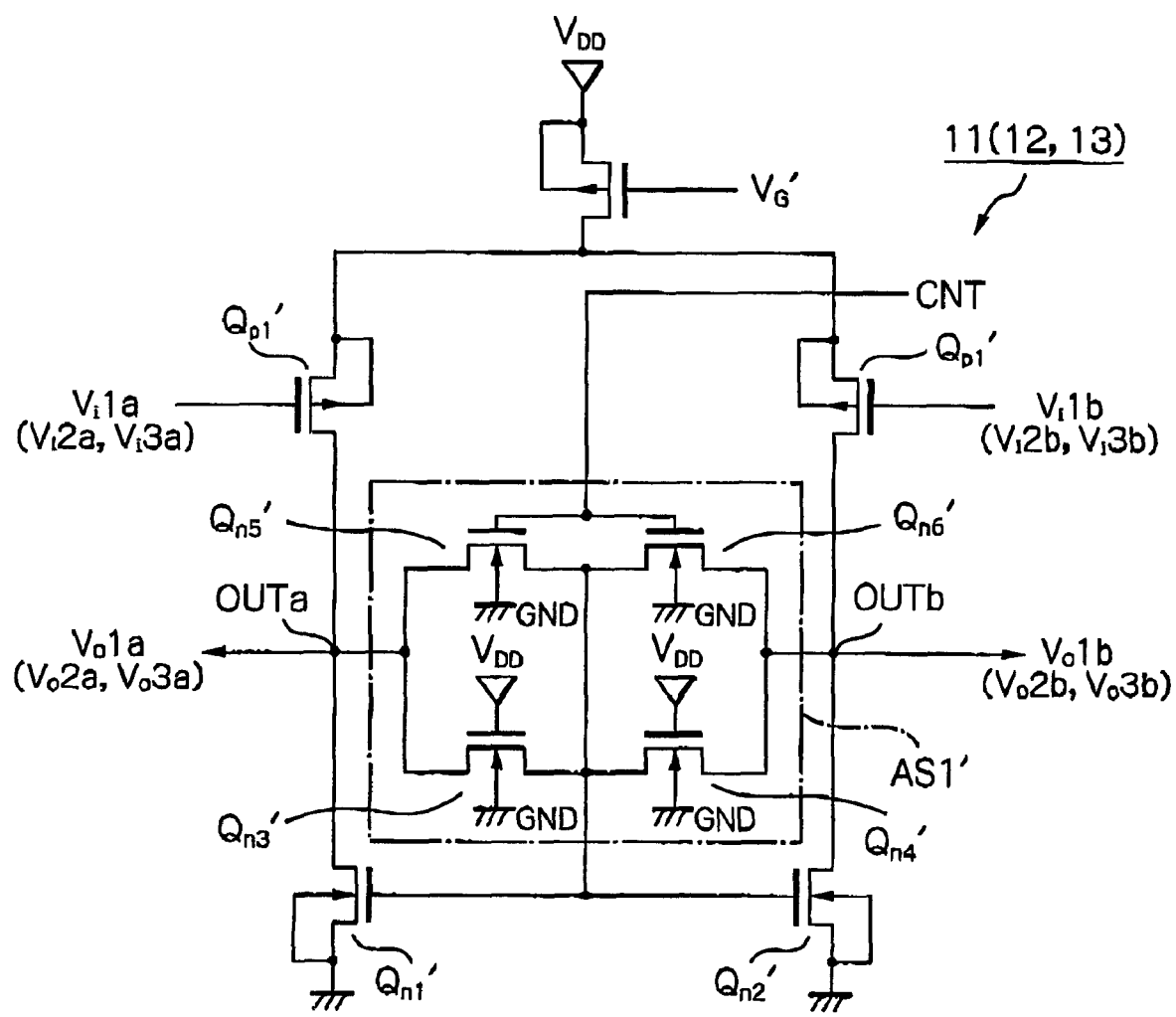
FIGS. 13, 14 and 15 are detailed circuit diagrams illustrating modifications of the fast/super fast differential amplifier of FIGS. 9, 11 and 12, respectively.
Figure 14:
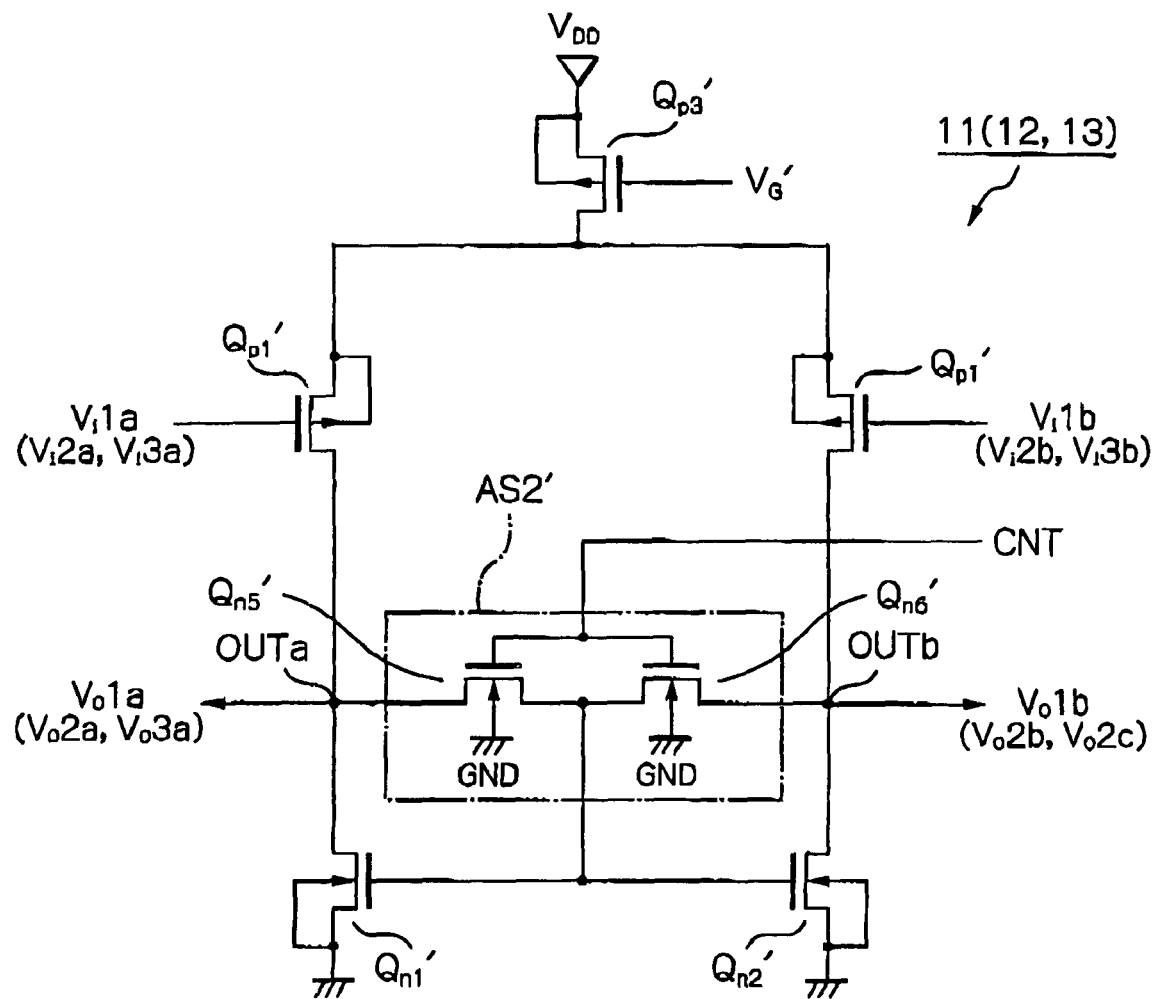
Figure 15:
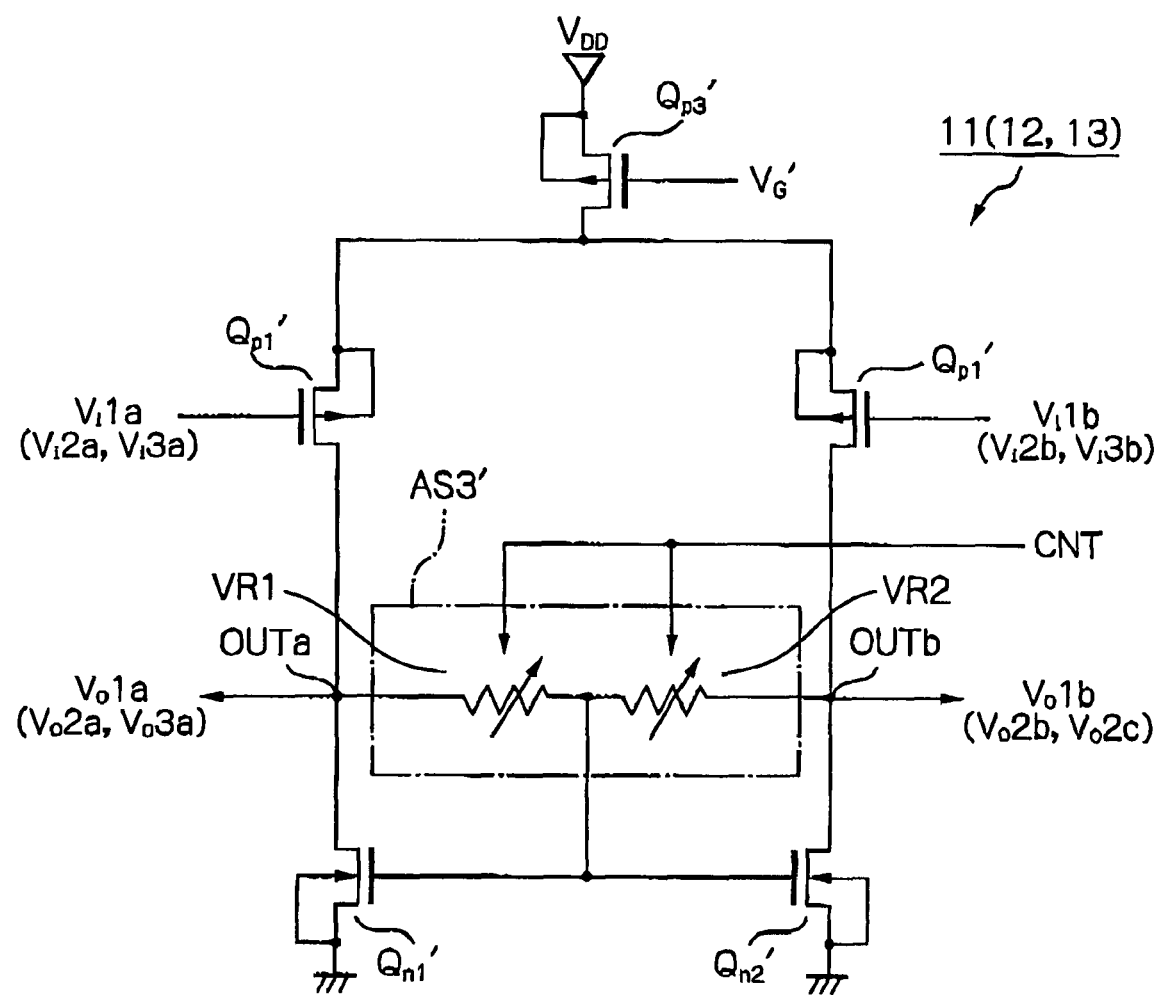

Also, the amplification and output impedance switching circuits AS1, AS2 and AS3 of FIG. 9 are replaced by amplification and output impedance switching circuits AS1', AS2' and AS3', respectively, as illustrated in FIGS. 13, 14 and 15, where the conductivity type of MOS transistors is changed. In FIGS. 13 and 14, the logic of the amplification and output impedance control signal CNT is opposite to that in FIGS. 9 and 11. Even the amplification and output impedance switching circuits AS1', AS2' and AS3' of FIGS. 13, 14 and 15 are operated in the same way as the amplification and output impedance switching circuit AS1 of FIG. 9.

In FIGS. 9, 11, 12, 13, 14 and 15, note that a plurality of amplifications and a plurality of output impedances can be set by providing a plurality of voltages as the amplification and output impedance control signal CNT.

Figure 16:
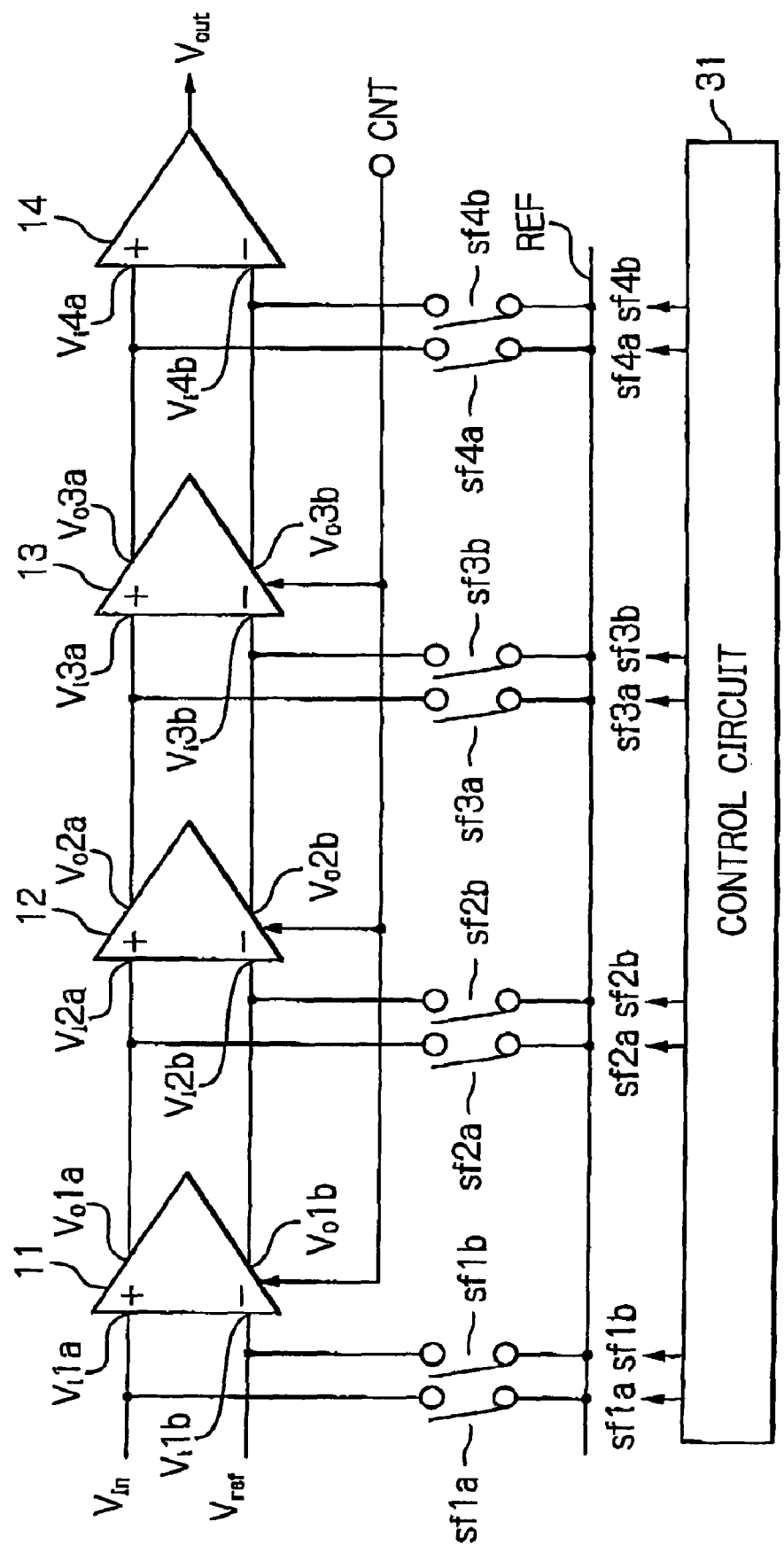
FIG. 16 is a circuit diagram illustrating a modification of the comparator of FIG. 8.

In FIG. 16, which illustrates a modification of the comparator of FIG. 8, the capacitors 21a, 21b, 22a, 22b, 23a and 23b of FIG. 8 are removed, and the amplification and output impedance control signal CNT is supplied from the exterior, not from the control circuit 31. That is, since the differential amplifiers 11, 12 and 13 serve as super fast differential amplifiers with a much lower output impedance in a super fast mode at an initial stage of each comparison operation, the absence of the capacitors 21a, 21b, 22a, 22b, 23a and 23b hardly affects the comparison operation. Also, when the amplification and output impedance control signal CNT is supplied from the exterior, the timing and voltage level of the amplification and output impedance control signal CNT can easily be adjusted, so that these timing and voltage level can be optimized.

In FIGS. 8 and 16, all the fast differential amplifiers 11, 12 and 13 are controlled by the amplification and output impedance control signal CNT; however, at least one of the fast differential amplifiers 11, 12 and 13 can be controlled by the amplification and output impedance control signal CNT.

The invention claimed is:

1. A comparator comprising:
   a plurality of first amplifiers of a two-input and two-output type connected in series;
   a second amplifier of a two-input and one-output type connected to a final one of said first amplifiers,
   an amplification and an output impedance of at least one of said first amplifiers being changed in response to a control signal; and
   a variable resistive element connected between outputs of said at least one of said first amplifiers.

2. The comparator as set forth in claim 1, wherein, first, said control signal has a first value to make said at least one of said first amplifiers have a first amplification and a first output impedance, and then, said control signal has a second value to make said at least one of said first amplifiers have a second amplification higher than said first amplification and a second output impedance higher than said first output impedance.

3. The comparator as set forth in claim 1, wherein said at least one of said first amplifiers comprises:
   first and second power supply terminals;
   first and second output terminals;
   a first load connected between said first power supply terminal and said first output terminal;
   a second load connected between said first power supply terminal and said second output terminal;
   a current source connected to said second power supply terminal;
   a first transistor connected between said first output terminal and said current source, a control terminal of said first transistor being adapted to receive an input voltage;
   a second transistor connected between said second output terminal and the current source, a control terminal of said second transistor being adapted to receive a reference voltage; and
   an amplification and output impedance switching circuit is connected between said first and second output terminals, said amplifier and output impedance switching circuit being adapted to control an amplification and an output impedance of said at least one of said first amplifiers in accordance with a control signal.

4. The comparator as set forth in claim 3, wherein said amplification and output impedance switching circuit comprises:
   a first resistance circuit connected between said first and second output terminals, said first resistance circuit having a constant resistance; and
   a second resistance circuit connected between said first and second output terminals, said second resistance circuit being adapted to receive said control signal to have a variable resistance.

5. The comparator as set forth in claim 3, wherein said amplification and output impedance switching circuit comprises a resistance circuit connected between said first and second output terminals, said resistance circuit being adapted to receive said control signal to have a variable resistance.

6. The comparator as set forth in claim 3, further comprising a control circuit adapted to generate said control signal.

7. The comparator as set forth in claim 6, being integrated into a semiconductor substrate.

8. The comparator as set forth in claim 3, wherein said amplification and output impedance switching circuit controls said first load and said second load.

9. The comparator as set forth in claim 3, wherein said first load and said second load comprise two transistors, and said amplification and output impedance switching circuit controls a gate voltage for said two transistors.

10. The comparator as set forth in claim 3, wherein said first power supply terminal comprises a terminal for a positive voltage and said second power supply terminal comprises a terminal for a ground.

11. The comparator as set forth in claim 3, wherein said first power supply terminal comprises a terminal for a ground and said second power supply terminal comprises a terminal for a positive voltage.

12. The comparator as set forth in claim 1, wherein, when said amplification and output impedance of said at least one of said first amplifiers are changed, operating output points of said at least one of said first amplifiers are unchanged.

13. The comparator as set forth in claim 1, wherein the amplification and output impedance are controlled by changing a resistance of said variable resistive element without changing resistance values of loads on said two outputs.

* * * * *